United States Patent
Herman et al.

(10) Patent No.: US 8,058,096 B2
(45) Date of Patent: Nov. 15, 2011

(54) MICROELECTRONIC DEVICE

(75) Inventors: Gregory Herman, Albany, OR (US);
Randy Hoffman, Corvallis, OR (US);
Tsuyoshi Yamashita, Corvallis, OR (US); J. Daniel Smith, Corvallis, OR (US)

(73) Assignee: Hewlett Packard Development Company, L.P., Houston, TX (US)

( * ) Notice: Subject to any disclaimer, the term of this patent is extended or adjusted under 35 U.S.C. 154(b) by 964 days.

(21) Appl. No.: 11/888,055

(22) Filed: Jul. 31, 2007

(65) Prior Publication Data

US 2009/0035899 A1 Feb. 5, 2009

(51) Int. Cl.
*H01L 21/00* (2006.01)
(52) U.S. Cl. .......................... 438/104; 438/151; 438/158
(58) Field of Classification Search .................. 438/104, 438/151, 158
See application file for complete search history.

(56) References Cited

U.S. PATENT DOCUMENTS

| | | | |
|---|---|---|---|
| 5,554,547 A | 9/1996 | Ha | |
| 7,427,776 B2* | 9/2008 | Hoffman et al. | 257/59 |
| 2002/0052059 A1 | 5/2002 | Lyu | |
| 2006/0113539 A1* | 6/2006 | Sano et al. | 257/59 |
| 2006/0197092 A1* | 9/2006 | Hoffman et al. | 257/72 |
| 2007/0054507 A1* | 3/2007 | Kaji et al. | 438/795 |
| 2007/0075365 A1* | 4/2007 | Mardilovich et al. | 257/347 |
| 2007/0085847 A1 | 4/2007 | Shishido | |
| 2008/0023703 A1* | 1/2008 | Hoffman et al. | 257/59 |
| 2008/0296568 A1* | 12/2008 | Ryu et al. | 257/43 |
| 2009/0035899 A1* | 2/2009 | Herman et al. | 438/151 |
| 2009/0166616 A1* | 7/2009 | Uchiyama | 257/43 |
| 2009/0289250 A1* | 11/2009 | Hoffman et al. | 257/43 |
| 2010/0090215 A1* | 4/2010 | Lee | 257/43 |

\* cited by examiner

*Primary Examiner* — Laura M Menz

(57) ABSTRACT

A thin film transistor is manufactured by a process including forming an oxide semiconductor channel, patterning the oxide semiconductor channel with a photolithographic process, and exposing the patterned oxide semiconductor channel to an oxygen containing plasma.

15 Claims, 2 Drawing Sheets

MICROELECTRONIC DEVICE

BACKGROUND

Microelectronic devices, such as thin film transistors (TFTs), may include oxide semiconductor channel layers. Use of oxide semiconductor channel layers may allow the fabrication of optically transparent TFTs, and may allow process advantages such as low temperature processing on plastic substrates. However, oxide semiconductor channel layers may exhibit fabrication challenges such as increased channel conductivity following certain process steps, such as photolithographic patterning. Increased conductivity of the oxide semiconductor channel layer may result in a TFT that is not easily turned off. Accordingly, there may be a need to provide a process to produce TFTs including oxide semiconductor channel layers having reduced conductivity.

DETAILED DESCRIPTION OF THE DRAWINGS

Figure 1:
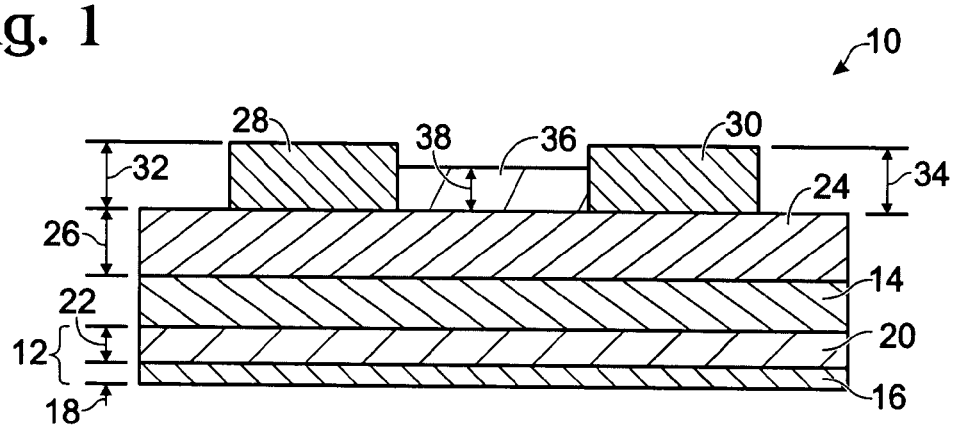
FIG. 1 is a schematic side cross-sectional view of one example embodiment of a microelectronic device.

FIG. 1 is a schematic side cross-sectional view of one example embodiment of a microelectronic device 10 manufactured in accordance with one example embodiment of a method of manufacturing a microelectronic device. In one example embodiment, device 10 may include an unpatterned gate contact 12 formed on an unpatterned p-type silicon (Si) wafer 14. Gate contact 12 may be manufactured of titanium and gold (Ti/Au) wherein the titanium region 20 has a thickness 22 of 10 nanometers (nm) and the gold region 16 has a thickness 18 of 300 nm. Silicon wafer 14 may be a 150 millimeter (mm) p-type silicon wafer which may function as the TFT gate. The gate contact 12 may be formed on wafer 14 utilizing backside processing techniques.

Silicon wafer 14 may include an unpatterned gate dielectric 24 formed thereon. Gate dielectric 24 may be manufactured of $SiO_2$, for example, and may have a thickness 26 of 100 nm. Gate dielectric 24 may be formed on wafer 14 utilizing frontside processing techniques.

Device 10 may further include a source 28 and a drain 30 each formed on gate dielectric 24. Both source 28 and drain 30 may be manufactured of indium tin oxide (ITO), for example, and may each have a thickness 32 and 34, respectively, of about 200 nm. Device 10 may further include a channel 36 having a thickness 38 of about 50 nm, which may be manufactured of an oxide semiconductor, and which may operatively connect source 28 and drain 30. Oxide semiconductor channel 36 may be manufactured of zinc oxide, tin oxide, indium oxide, gallium oxide, zinc indium oxide, zinc tin oxide, indium gallium oxide, zinc indium gallium oxide, and any combination thereof, for example. In one example embodiment the oxide semiconductor channel 36 may define an oxide with cations selected from at least one of Zn, In, Ga, and Sn.

In one example manufacturing process, the source 28 and drain 30 electrodes are formed on gate dielectric 24 by RF sputtering and lift-off photolithographic patterning to define desired lateral dimensions, as suitable for the device or circuit being fabricated. Oxide semiconductor channel 36 of zinc indium oxide (ZIO) is then formed by rf sputtering with a target composition of $ZnIn_4O_7$ to thickness 38 of 50 nm and lift-off or etch photolithographic patterning to define desired lateral dimensions, as suitable for the device or circuit being fabricated. The entire structure 10 is then annealed in air at a temperature of 175 degrees Celsius (C) for sixty minutes, with a ramp up and a ramp down temperature gradient of two degrees Celsius per minute to reach the maximum temperature of 175 degrees Celsius, for example.

The oxide semiconductor channel 36 is then exposed to an oxygen containing plasma treatment for a time of at least two minutes, and approximately four minutes, at an energy level of at least 900 Watts, and approximately 1,000 Watts, at a oxygen ($O_2$) flow rate of at least 30 sccm, and approximately 40 sccm, and at a pressure of at least 40 mTorr, and approximately 50 mTorr.

The oxide semiconductor channel 36 is once again annealed in air at a temperature of 175 degrees Celsius for sixty minutes, with a ramp up and a ramp down temperature gradient of two degrees Celsius per minute, for example. This example process yields a bottom gate coplanar type TFT microelectronic device 10 with a blanket gate contact 12, a blanket gate dielectric 24, and with photolithographic patterned source 28, drain 30 and oxide semiconductor channel 36.

The plasma treatment process described here may be applied to a variety of known TFT structures, including top-gate, bottom-gate, or double-gate configurations, and staggered or coplanar electrode configurations. A top-gate TFT is oriented such that the gate electrode lies above the channel (wherein the term "above" is defined with respect to the surface of the substrate upon which the TFT is disposed); a bottom-gate TFT, conversely, is oriented such that the gate electrode lies below the channel; a double-gate TFT includes two gate electrodes, one above and the other below the channel. In a coplanar electrode configuration, the source and drain electrodes are positioned on the same side of the channel as is the gate electrode; conversely, in a staggered electrode configuration, source and drain electrodes are positioned on the opposite side of the channel as is the gate electrode.

The inclusion of the oxygen containing plasma exposure step into the fabrication process of device 10, following photolithographic patterning of the oxide semiconductor channel layer 36, has been found to effectively reduce an undesirable high channel conductivity that may be induced within the semiconductor channel 36 during photolithographic patterning. Accordingly, a device 10 manufactured according to the present method has excellent on-to-off ratios and allows control of the turn-on voltage of the device 10. In particular, after such processing, the oxide semiconductor channel layer 36 defines a channel conductance of effectively zero at a turn-on voltage of the thin film transistor, wherein a channel conductance of "effectively zero" is defined as a channel sheet resistance greater than or equal to about $10^8$ Ohms/square. In the case where the TFT channel layer contains a non-zero equilibrium (i.e., in the absence of external influence such as the application of a non-zero gate voltage) population of free electrons, a channel conductance of "effectively zero" may be achieved when the TFT channel is effectively depleted of any equilibrium population of free electrons with the application of a suitable negative gate voltage, such as a voltage in a range of negative fifteen to zero volts.

The oxygen containing plasma may include other gases in addition or in combination with oxygen, such as inert or non-inert gases, including He, Ar, Kr, $N_2$, $N_2O$, and the like. The plasma may also be described as a non-reducing agent gas containing oxygen ($O_2$ or another oxygen-containing species), and/or a non-etching agent gas containing oxygen ($O_2$ or another oxygen-containing species).

A variety of different methods may be used to form the oxygen containing plasma. For example, the oxygen containing plasma may be formed according to one of many methods including, but not limited to: concentric cylinder and planar dielectric barrier, pulsed corona, e-beam, hollow cathode, electron cyclotron resonance, helicon, helical resonator, inductively/transformer coupled, plasmatron, plasma torch, and flow discharge, and the like, for example.

Figure 2:
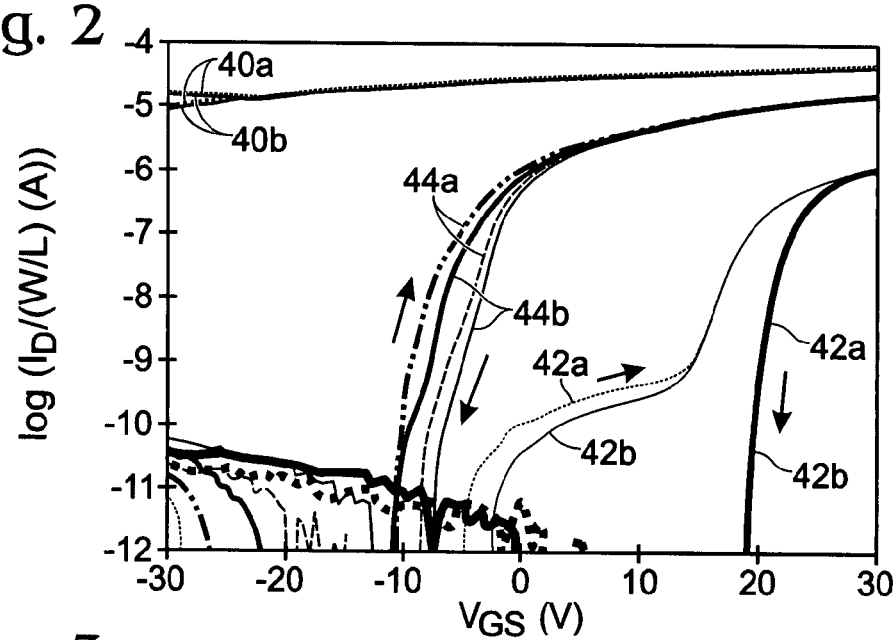
FIGS. 2 and 3 are graphs showing experimental data for sample microelectronic devices including an etched photolithographic oxide semiconductor channel layer.
Figure 3:
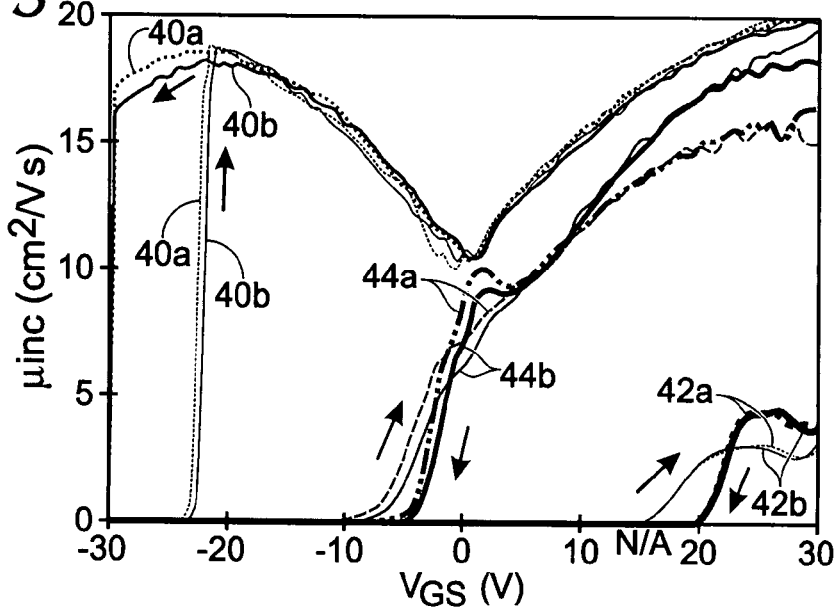

FIGS. 2 and 3 are graphs showing experimental data for a sample microelectronic device 10 including an etched photolithographically-patterned oxide semiconductor channel layer 36 of zinc indium oxide (ZIO). FIG. 2 shows drain current versus gate-to-source voltage ($I_D$-$V_{GS}$), taken in double-sweep mode (i.e., $V_{GS}$ is swept from −30 V to +30 V, then back to −30 V wherein the directional arrows in the figures show the direction of the sweep), for a TFT test structure. FIG. 3 shows mobility versus gate-to-source voltage (u-$V_{GS}$) for a TFT test structure. Each of FIGS. 2 and 3 show electrical data taken following the first 175 C anneal 40 (40a for a first test device and 40b for a second test device), following the oxygen containing plasma exposure 42 (42a for a first test device and 42b for a second test device), and following the second 175 C anneal 44 (44a for a first test device and 44b for a second test device). As shown in FIGS. 2 and 3, following the first 175 C anneal 40, and before the oxygen containing plasma exposure, the ZIO channel 36 is highly conductive and there is little gate-voltage-controlled modulation of the drain current. After the oxygen containing plasma exposure 42 the drain conductivity has been substantially reduced, being effectively zero at $V_{GS}$=0 volts. However the device performance is poor as seen in the large split (hysteresis/instability) between the forward and reverse portions of the $V_{GS}$ sweep (the arrows show the direction of the $V_{GS}$ sweep), and reduced mobility (low maximum "on" $I_D$). After the second anneal 44, the mobility increases to a value of approximately fifteen to twenty $cm^2$/V s, the split between forward and reverse portions of the $V_{GS}$ sweep is greatly reduced, and the turn-on voltage ($V_{on}$) magnitude remains at a workable, although moderately negative, value.

Figure 4:
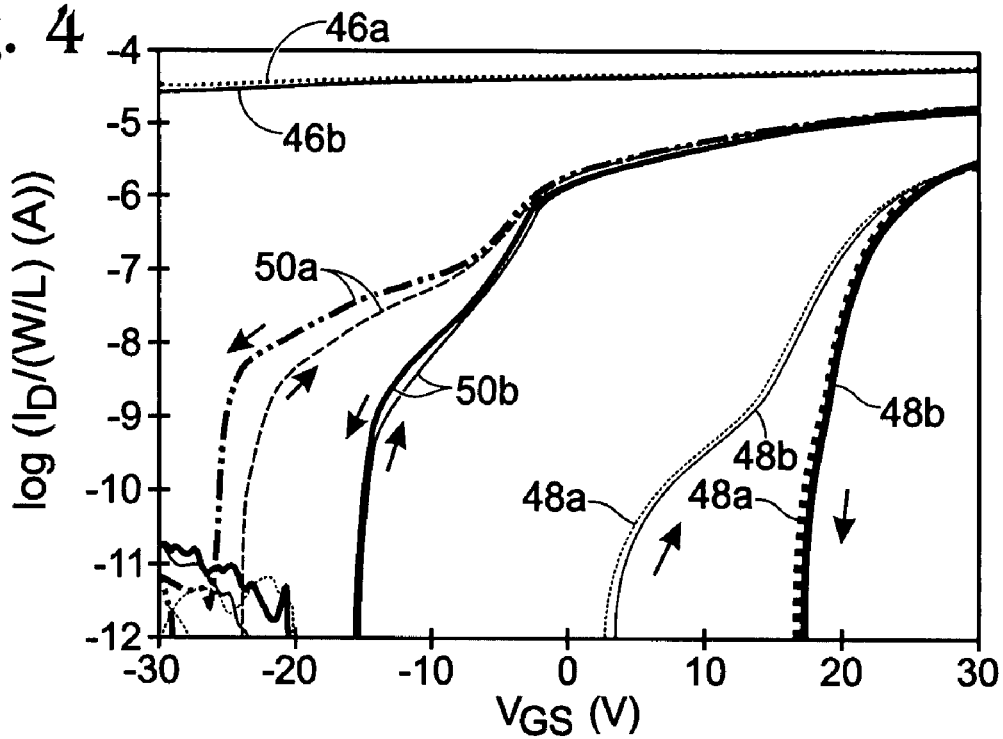
FIGS. 4 and 5 are graphs showing experimental data for sample microelectronic devices including a lift-off photolithographic oxide semiconductor channel layer.
Figure 5:
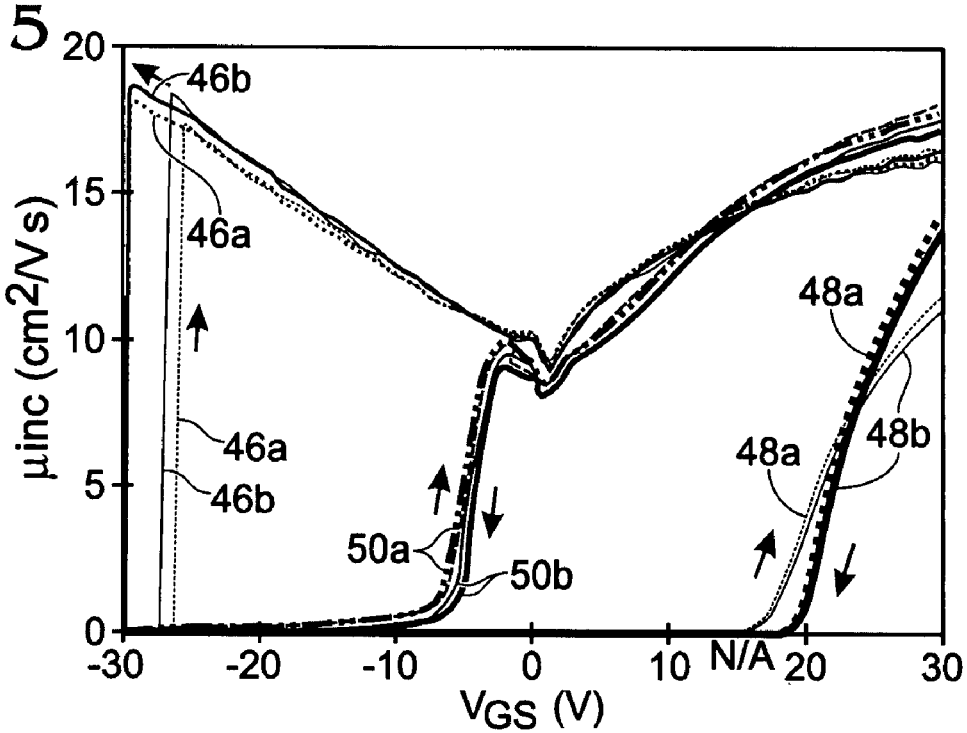

FIGS. 4 and 5 are graphs showing experimental data for a sample microelectronic device 10 including a lift-off photolithographically-patterned oxide semiconductor channel layer 36 of zinc indium oxide (ZIO). FIG. 4 shows drain current versus gate-to-source voltage ($I_D$-$V_{GS}$), taken in double-sweep mode (i.e., $V_{GS}$ is swept from −30 V to +30 V, then back to −30 V), for a TFT test structure. FIG. 5 shows mobility versus gate-to-source voltage (U-$V_{GS}$) for a TFT test structure. Each of FIGS. 4 and 5 show electrical data taken following the first 175 C anneal 46 (46a for a first test device and 46b for a second test device), following the oxygen containing plasma exposure 48 (48a for a first test device and 48b for a second test device), and following the second 175 C anneal 50 (50a for a first test device and 50b for a second test device). As shown in FIGS. 4 and 5, following the first 175 C anneal 46, and before the oxygen containing plasma exposure, the ZIO channel 36 is highly conductive and there is little gate-voltage-controlled modulation of the drain current. After the oxygen containing plasma exposure 48 the drain conductivity has been substantially reduced, being effectively zero at $V_{GS}$=0 volts. However the device performance is poor as seen in the large split (hysteresis/instability) between the forward and reverse portions of the $V_{GS}$ sweep (the arrows show the direction the $V_{GS}$ sweep), and reduced mobility (low maximum "on" $I_D$). After the second anneal 50, the mobility increases to a value of approximately fifteen to twenty $cm^2$/V s, the split between forward and reverse portions of the $V_{GS}$ sweep is greatly reduced, and the turn-on voltage ($V_{on}$) magnitude remains at a workable, although moderately negative, value.

Other variations and modifications of the concepts described herein may be utilized and fall within the scope of the claims below.

We claim:

1. A method of making a thin film transistor, comprising:
forming an oxide semiconductor channel;
patterning said oxide semiconductor channel with a photolithographic process to form a patterned oxide semiconductor channel; and
exposing said patterned oxide semiconductor channel to an oxygen containing plasma;
wherein said exposing said patterned oxide semiconductor channel to said oxygen containing plasma is conducted for a time of at least two minutes, at an energy level of at least 900 Watts, at an oxygen containing gas flow rate of at least 30 sccm, and at a pressure of at least 40 mTorr.

2. The method of claim 1, further comprising forming a source and a drain, wherein said oxide semiconductor channel connects said source and said drain.

3. The method of claim 1 wherein said oxide semiconductor channel is formed on a gate dielectric.

4. The method of claim 1 wherein said photolithographic process is chosen from one of an etch photolithographic process and a lift-off photolithographic process.

5. The method of claim 1 wherein said oxide semiconductor channel is formed by rf sputtering and defines a thickness in a range of 10 nm to 200 nm.

6. The method of claim 1, wherein said oxide semiconductor channel comprises an oxide with cations selected from at least one of Zn, In, Ga, and Sn.

7. The method of claim 1, wherein said oxide semiconductor channel comprises zinc indium oxide.

8. The method of claim 7, wherein said zinc indium oxide comprises a Zn:In atomic ratio in a range of 5:1 to 1:5.

9. The method of claim 7, wherein said zinc indium oxide comprises a Zn:In atomic ratio of 1:4.

10. A method of making a thin film transistor, comprising:
forming an oxide semiconductor channel;
patterning said oxide semiconductor channel with a photolithographic process to form a patterned oxide semiconductor channel;
annealing said patterned oxide semiconductor channel in air at a temperature of at least 150° C.; and
then exposing said annealed and patterned oxide semiconductor channel to an oxygen containing plasma;
wherein said annealing is conducted for at least fifty minutes.

11. A method of making a thin film transistor, comprising:
forming an oxide semiconductor channel;
patterning said oxide semiconductor channel with a photolithographic process to form a patterned oxide semiconductor channel;
exposing said patterned oxide semiconductor channel to an oxygen containing plasma; and
after exposing said patterned oxide semiconductor channel to said oxygen containing plasma, annealing said patterned oxide semiconductor channel in air at a temperature of at least 150° C. wherein said annealing is conducted for at least fifty minutes.

12. The method of claim 10, wherein said oxide semiconductor channel comprises an oxide with cations selected from at least one of Zn, In, Ga, and Sn.

13. The method of claim 10, wherein said oxide semiconductor channel comprises zinc indium oxide.

14. The method of claim 11, wherein said oxide semiconductor channel comprises an oxide with cations selected from at least one of Zn, In, Ga, and Sn.

15. The method of claim 11, wherein said oxide semiconductor channel comprises zinc indium oxide.

* * * * *

UNITED STATES PATENT AND TRADEMARK OFFICE
CERTIFICATE OF CORRECTION

PATENT NO. : 8,058,096 B2  Page 1 of 1
APPLICATION NO. : 11/888055
DATED : November 15, 2011
INVENTOR(S) : Gregory Herman et al.

It is certified that error appears in the above-identified patent and that said Letters Patent is hereby corrected as shown below:

In column 5, line 1, in Claim 11, delete "150° C." and insert -- 150° C., --, therefor.

Signed and Sealed this
Seventh Day of August, 2012

David J. Kappos
*Director of the United States Patent and Trademark Office*